United States Patent [19]

Smith et al.

[11] Patent Number: 4,636,965

[45] Date of Patent: Jan. 13, 1987

[54] ROUTING METHOD IN COMPUTER-AIDED-CUSTOMIZATION OF UNIVERSAL ARRAYS AND RESULTING INTEGRATED CIRCUIT

[75] Inventors: David C. Smith, Williamstown; Richard Noto, Maple Shade, both of N.J.

[73] Assignee: RCA Corporation, Princeton, N.J.

[21] Appl. No.: 608,772

[22] Filed: May 10, 1984

[51] Int. Cl.⁴ .............................................. G06F 15/20
[52] U.S. Cl. .................................... 364/491; 364/489; 357/45
[58] Field of Search ......................... 364/300, 488–491; 357/45; 29/846, 847, 848; 174/68.5

[56] References Cited

U.S. PATENT DOCUMENTS

| | | | |
|---|---|---|---|
| 3,567,914 | 3/1971 | Neese et al. | 364/489 |
| 3,653,072 | 3/1972 | Ballas et al. | |
| 3,702,004 | 10/1972 | Eskew et al. | 364/489 |
| 4,500,963 | 2/1985 | Smith et al. | 364/300 |

FOREIGN PATENT DOCUMENTS

| | | | |
|---|---|---|---|
| 2243568 | 3/1974 | Fed. Rep. of Germany | 364/491 |
| 3238311 | 4/1984 | Fed. Rep. of Germany | 357/45 |
| 0020447 | 2/1982 | Japan | 357/45 |

Primary Examiner—Parshotam S. Lall

Attorney, Agent, or Firm—Joseph S. Tripoli; Robert L. Troike; Robert Ochis

[57] ABSTRACT

A routing process for automatic computer aided routing of customizing conductors in a universal array which has a single customizing conductive layer is improved by executing a pathfinding routing process for conductors which connect pins on the same row before routing other conductor types. Routing of conductors which connect a pin on the side surface to a pin in the basic unit row region is improved by initially restricting permissible routes to be within a set of three contiguous rectangles. Routing opportunities for potentially failed conductors are increased by allowing customizing conductors to extend parallel to the length of the basic unit rows in the region between adjacent tunnel ranks in the final routing step. An improved custom IC results.

The conductor number of the shortest and the longest conductor in each class is stored separately from the routing grid matrix so that these numbers can be directly retrieved as needed.

Since the conductors are arranged in class and length order in the wiring matrix, the routing process in going through any class of conductors in an attempt to route them retrieves them in a length order (long-to-short or short-to-long).

18 Claims, 11 Drawing Figures

ROUTING METHOD IN COMPUTER-AIDED-CUSTOMIZATION OF UNIVERSAL ARRAYS AND RESULTING INTEGRATED CIRCUIT

STATEMENT OF GOVERNMENT RIGHTS

The Government has rights in this invention pursuant to Contract No. DAAK20-82-C-0397 awarded by the Department of the Army.

RELATED APPLICATION

This Patent is related to a Patent Application entitled, "CELL PLACEMENT METHOD IN COMPUTER-AIDED-CUSTOMIZATION OF UNIVERSAL ARRAYS AND RESULTING INTEGRATED CIRCUIT" by Richard Noto and David C. Smith, Ser. No. 608,788 co-filed herewith on May 10, 1984, assigned to the present assignee, and incorporated herein by reference.

BACKGROUND OF THE INVENTION

This invention relates to the field of computer aided design of very large scale integration (VLSI) semiconductor circuits and more particularly to the design and production of customizing masks for universal arrays.

Universal array integrated circuits (ICs) are used to test IC designs and for production of ICs. One such universal array is the 800 gate automated universal array or AUA developed by RCA Corporation in cooperation with the Department of the Army under a series of contracts. A plurality of these AUAs are fabricated on a semiconductor wafer. Each AUA comprises an interior row region containing many parallel rows of identical basic units each containing four semiconductor devices. This interior basic unit row region is surrounded by a rectangular annular region of peripheral devices and contact pads for the connection of external wires to the IC. The rows of basic units are spaced apart by wiring roadbeds. These roadbeds contain wiring channels which run parallel to the length of the basic unit rows and wiring lanes which run perpendicular to the length of the basic unit rows. Each wiring lane comprises an aligned series of five tunnels which have their adjacent ends spaced apart. All of the tunnels adjacent to one edge of a basic unit row comprise a tunnel rank. The next adjacent set of tunnels comprise another tunnel rank and so on. Each tunnel rank has three of the wiring channels disposed thereover.

An electrically insulating layer covers both the semiconductor devices and the tunnels except at predetermined contact points where it is desired to have electrical contact between a semiconductor device or a tunnel and an overlying, conductive, metallic customizing layer. The customizing layer covers an entire major surface of the semiconductor wafer and is initially in electrical contact with the contacts of all the semiconductor devices and tunnels. To customize this universal array semiconductor wafer into a plurality of integrated circuits having a desired set of electrical characteristics the customizing conductive layer is coated with photoresist and exposed to activating radiation through a custom patterned mask. The custom mask pattern causes the activating radiation to protect those portions of the conductive material which are needed to interconnect the semiconductor devices and tunnels into the desired IC, while leaving unprotected the remaining portions of the customizing conductive layer. The unprotected portions of the customizing layer are removed by etching and the wafer is passivated to prevent environmental damage to the ICs. The completed wafer is tested and diced to provide a plurality of individual ICs all having the desired characteristics.

Where a tunnel in one tunnel rank is to be connected to a tunnel in the next tunnel rank, it can be connected to the aligned tunnel in that next rank or to either of the tunnels adjacent to that aligned tunnel.

The use of a single conductive layer to convert a stock, pre-processed, AUA wafer into a plurality of the desired custom ICs enables rapid completion of the desired ICs once the customizing mask is completed. It is possible to convert a stockpiled wafer into custom ICs in 24 to 48 hours.

Because hand design of customizing masks for these arrays is prohibitively time consuming and expensive, an AUA automatic placement and routing system developed by RCA Corporation is used to automatically design the customizing mask. This system, like the array, was developed by RCA Corporation in cooperation with the Department of the Army under a series of contracts. The software for this system is available in source code form from the Army's Electronics Research and Development Command (ERADCOM), Fort Monmouth, N.J. for use on government contracts. That software is known as the AUA or 800 gate AUA program, version 1.5 and is incorporated herein by reference. This computer aided design (CAD) system can produce a customizing mask for this AUA from a specification of the desired IC in terms of logic gates or "logic cells" selected from a set of available "logic cells" and the connections needed between those "logic cells". The term "logic cell" refers to the one or more basic units which when interconnected by customizing conductors form a logic gate such as an AND gate, OR gate, Flip Flop, etc. This CAD system accepts such a specification of the IC and generates a specification of a mask pattern which can be used to pattern the customizing conductive layer to convert a stock 800 gate AUA into the desired custom ICs. This is done through a process involving automatic assignment of logic cells to basic unit rows of the universal array, automatic placement of assigned logic cells along the basic unit rows and automatic routing of customizing conductors. The resulting mask specification is used to control a mask generating system which converts that specification into the physical pattern of the mask. Thereafter that mask is used in a photoetcher to customize a universal array wafer into a number of the specified ICs.

The computer aided design system must ensure that 100% of the customizing conductors are routed automatically in order for its mask specification to be directly convertible to the final mask used to pattern the customizing layer.

Semiconductor area is wasted if a routing system must restrict an IC design to actually using (connecting into its circuit) only a relatively low percentage (such as 60% or 70%) of the universal array's basic units. Some placement and routing systems must impose such restrictions in order to ensure the routing system's ability to complete the routing of 100% of the connecting conductors. It is desirable that the automatic system be able to complete 100% of the routing in circuits which use high percentages (>80%) of the gates which are available in the universal array.

The AUA automatic placement and routing program cited above is capable of routing 100% of the conductors in the 800 gate AUA to which it applies, even when as many as 90% or more of the basic units are utilized in a random logic circuit.

That AUA automatic placement and routing software employs a routing grid in which each point on the grid is defined by a pair of x and y coordinates. These grid points correspond to physical locations on an actual AUA chip. The grid points are spaced apart in accordance with the design rules of the chip as to conductor width and spacing. Each electrical contact between the customizing layer and a logic cell pin device or tunnel contact is located at a grid point. In addition, each location where a conductor may run can be defined in terms of grid points.

Two different routing techniques are used. One of these is direct routing. In direct routing, the process checks each route in a specific, limited set of possible routes to see if one of those routes is available for the conductor being routed. These routes follow straight line segments which extend parallel to either the x-axis or the y-axis of the grid. The router selects the first one of these routes which is available as the route that conductor will take. If none of those routes is available, then the direct routing process can not route that conductor within the set of routes checked. The availability of a route is determined by checking each grid point on it to see if it is available. A grid point is available if it is not occupied by a conductor which is part of a different node. A node is a set of pins of active basic units all of which must be connected together by conductors and those connecting conductors. All of the conductors and pins of a node are at the same electrical potential.

The other of these routing techniques is pathfinding routing. In pathfinding routing, the search for an available route begins at one of the pins to be connected (the source pin) and works toward the other pin (the sink pin). This search technique checks each grid point which is adjacent to the source pin to see if it is available for the routing of the conductor being routed. All of those grid points which are available are included in an array of available grid points. A grid point is available for the routing of a conductor if it is in the region then allowed for the routing of that conductor and is not occupied by a conductor in a different node. Those grid points which are adjacent to the source pin and available are given the number 1. This process is repeated for each of those available grid points while treating those grid points as source pins. Available grid points adjacent to a number 1 grid point are assigned the number 2. This process is repeated until the sink pin grid point is reached. Then a route for the conductor is determined by tracing the numbers assigned to grid points in a decreasing order from the sink pin to the source pin. In assigning numbers to grid points, the use of some grid points can be discouraged by including a penalty in the number assigned to that grid point by giving it a number which is more than 1 higher than the number of the grid point from which it was reached. Such penalties effect the way in which the route is established during the back tracing of the route which has been found. If there is an available route within the allowed routing region, then this pathfinding process will find it.

In the latter stages of its routing process this AUA software uses a rerouting process in order to increase the number of conductors which it can route. A rerouting process is one which tests each conductor on a grid point by grid point basis to see if that conductor or part of it can be moved over into a different wiring channel which has a lower priority. The priority of wiring channels is established so that those which are located farthest from tunnel contacts and cell pins are filled first. Where possible, the rerouting process moves already routed conductors into lower priority wiring channels to make wiring channels adjacent to tunnel contacts and cell pins available for further routing.

Today universal arrays are desired with 2500 or more equivalent logic gates. The design of such a large universal array in a manner in which it is still customizable by a single conductive layer which is automatically designed is a major challenge. Such an array design is the subject of the patent application entitled, VARIABLE GEOMETRY AUTOMATED UNIVERSAL ARRAY, by Richard Noto, Ser. No. 474,511, filed Mar. 11, 1983, now U.S. Pat. No. 4,568,961, which is assigned to the present assignee. That Application is incorporated herein by reference. Design of a computer aided design system capable of customizing such a large array in an efficient manner is another major challenge. The present invention provides an automatic routing system which is capable of efficiently routing the conductors of the single customizing layer of that large universal array. The design of that array and this software are interrelated.

SUMMARY OF THE INVENTION

The present invention improves the automatic routing of conductors in a universal array having a single customizing layer. This involves specifying the order in which conductors are routed, the routing techniques used and the locations in which conductors may be routed at each stage of the routing process. Routing of conductors which connect two pins on the same row is improved by routing these conductors (a) by a direct routing process in the wiring channels in a first routing region, followed by (b) a pathfinding routing process in the first routing region for any of these conductors which remain unrouted, followed by (c) a rerouting process, followed by (d) a pathfinding routing process in the first routing region for any of these conductors which remain unrouted.

Routing of conductors which connect pins on two adjacent rows is improved by dividing them into two groups: those which are too long to route diagonally and those which are short enough to be routed diagonally. Routing of conductors in that longer group begins with the longest conductors and works toward shorter conductors until a predetermined limit is reached. It then skips the intervening conductors and jumps to the shortest conductor in this group and continues routing by taking conductors in a short-to-long sequence until all unrouted conductors have been tried in the short-to-long order. This routing process is limited to routes which have wiring channel segments over preferred tunnel ranks. During the long-to-short portion of the process permitted routes are limited to preferred wiring channels within those allowed tunnel ranks.

Routing of the shorter group of conductors which connect pins on adjacent rows is improved by routing them in a short-to-long order in two stages. On a first pass, each of these conductors is tried as a conductor having a single wiring channel segment located in the wiring channels over the first tunnel rank adjacent to either one of its pins. On a second pass, any of these conductors which remain unrouted are tried as diagonal routes.

The routing of conductors which connect a pin on the side peripheral region to a pin in the row region is improved by limiting the permitted routing region to three contiguous rectangles. During the initial attempt to route these conductors the rectangles are narrow. The size of the rectangles is increased during a subsequent attempt to route any of these conductors which were not routed during the first attempt.

The final stage of the routing process is improved by removing the restriction which during the rest of the routing process prevents conductors from being routed parallel to the length of the rows in the region between adjacent tunnel ranks. An improved final IC may include such conductors.

DETAILED DESCRIPTION OF THE PREFERRED EMBODIMENT

Figure 1:
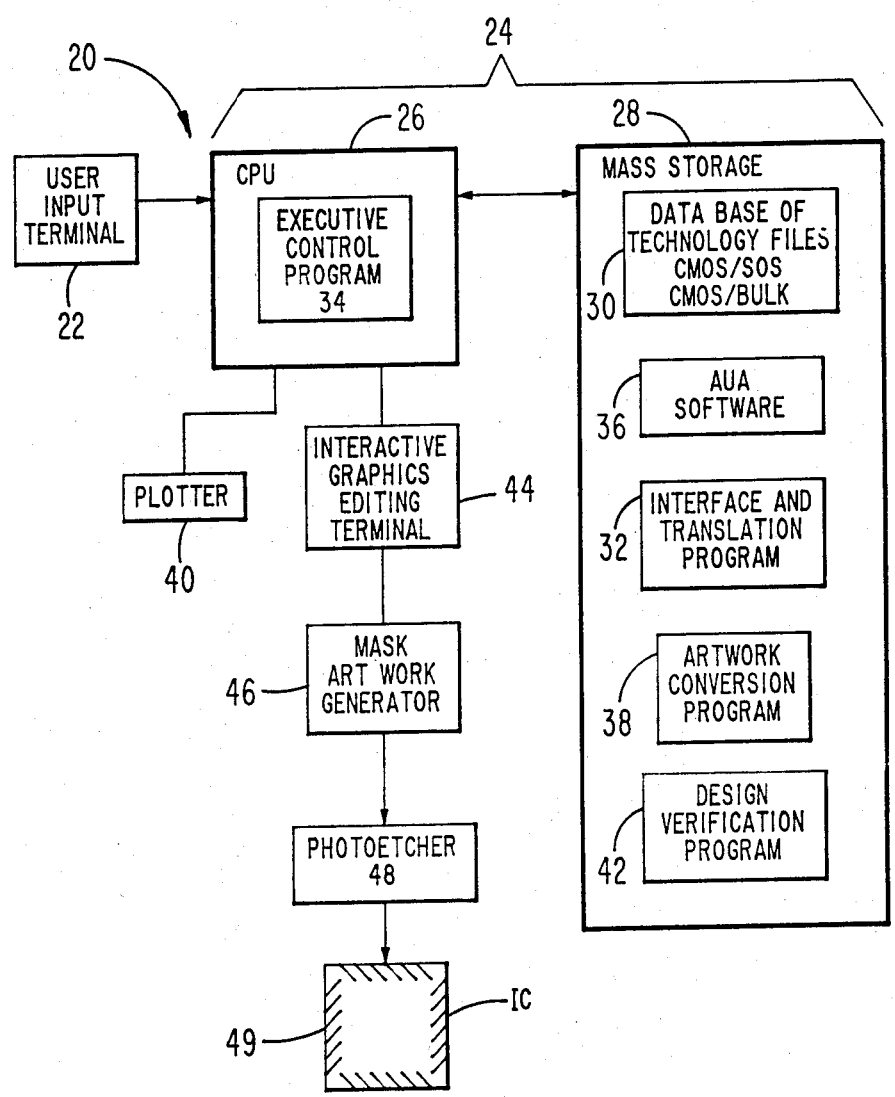
FIG. 1 illustrates in block diagram form a computer aided design system which is improved by the present invention.

A computer aided design (CAD) system suitable for customizing universal arrays is illustrated generally at 20 in block diagram form in FIG. 1. CAD system 20 comprises an input system 22 through which the user's integrated circuit (IC) definition is entered. A data management and control system 24 comprises a central processing unit (CPU) 26 and a storage system 28. Storage system 28 includes files containing a data base 30 which includes one technology file for an AUA array in CMOS/SOS and another technology file for the AUA array in bulk CMOS. CMOS is an acronym for Complementary Metal Oxide Silicon circuitry. SOS is an acronym for Silicon On a Sapphire substrate and is used to refer to a semiconductor on any electrically insulating substrate. Bulk refers to circuitry in a single body of semiconductor material.

The storage system includes a number of programs which are transferred to the CPU as needed. One of these is an interface and translation program 32. Under the control of a control executive program 34, the interface and translation program combines the user's input and the AUA technology file for the selected technology into a placement and routing file containing the user specified logic cells and their pin interconnections.

This is the input file on which the automatic placement and routing program operates. In this file, the routing surface of the universal array is represented in a large $M \times N$ array which contains an entry for each point on the wiring grid of the universal array. To prevent confusion between data arrays like this $M \times N$ array and the universal array which is to be customized, any data array will be referred to hereafter as a matrix. Each of these matrix entries includes the status of the corresponding grid point. Included in the status data for each grid point is whether that grid point has been used for routing a conductor. If that grid point has not been used for routing a conductor, then the data in it is the number zero. If that grid point has been used for routing a conductor, then the data in it is the number of the node of which that conductor is part. A node is a set of active basic unit pins all of which are connected together by conductors and includes those connecting conductors. All of the conductors and pins of a node are at the same electrical potential.

The input file for the automatic placement and routing program contains a list of all of the logic cells which must be included in the universal array in order for it to provide the desired IC functions. That input file also contains a list of the pin to pin connections which must be made among the logic cells in order to provide the desired IC. The placement portion of the AUA software 36 places the logic cells specified in the input file at specific locations in specific rows.

The routing portion of the AUA software generates a conductor list matrix which contains a row entry for each conductor which must be routed by the routing portion of the AUA software. The conductor entries (the rows of the matrix) are arranged by conductor class and conductor length so that data on conductors can be retrieved in class and length order by sequential access to this matrix's entries. The various columns of this matrix provide different needed information about the conductors. The first of these columns contains the number of the node of which that conductor is a part. This node number is positive if the conductor has not been routed. Once the conductor has been routed, the node number entry is given a negative sign. Thus, the sign of the node number serves as a routing flag. Other column entries specify the positions of the two pins which that conductor is to interconnect (i.e., the conductor's end points), the length of that conductor, and that conductor's class. The length entry is the sum of the x-direction spacing between the pins and the y-direction spacing between the pins. These length and class entries are the basis of the ordering of the conductor row entries by class and length.

The conductor number of the shortest and the longest conductor in each class is stored separately from the routing grid matrix so that these numbers can be directly retrieved as needed. Since the conductors are arranged in class and length order in the wiring matrix, the routing process in going through any class of conductors in an attempt to route them preferably retrieves them in a length order (long-to-short or short-to-long).

The routing portion of the software does not retain a record of where any individual conductor was routed. Rather, the record it keeps is of what node occupies each point in the wiring grid and the fact that a conductor has been routed. This is sufficient routing information about the custom interconnecting conductors to enable the routing program to complete its tasks of routing customizing conductors and generating mask data.

The output from the AUA automatic placement and routing software 36 is a definition of a customizing mask in the Banning Artwork Language. An artwork conversion program 38 converts this mask definition into a form which is appropriate to drive a plotter 40, a design verification program 42, and an interactive graphics editing system 44. The plotter 40 is used to provide a hard copy which the designer can review. The design verification program 42 checks the design to be sure that the defined mask will actually provide the connections it is supposed to provide and does so without introducing any connections it should not and without violating any of the design rules for the universal array—that is line widths, spacings and so forth. The interactive graphics editing system 44 is used to edit the mask design to correct any design errors which have been identified. The output of the interactive graphics editor 44 is provided to an artwork mask generating system 46 which generates the physical pattern of the mask. The resulting mask is used in a photoetching system 48 to customize AUA wafers to create the desired IC 49.

The prior art routing process on which this invention improves employs both a direct routing process and a pathfinding routing process.

Figure 2A:
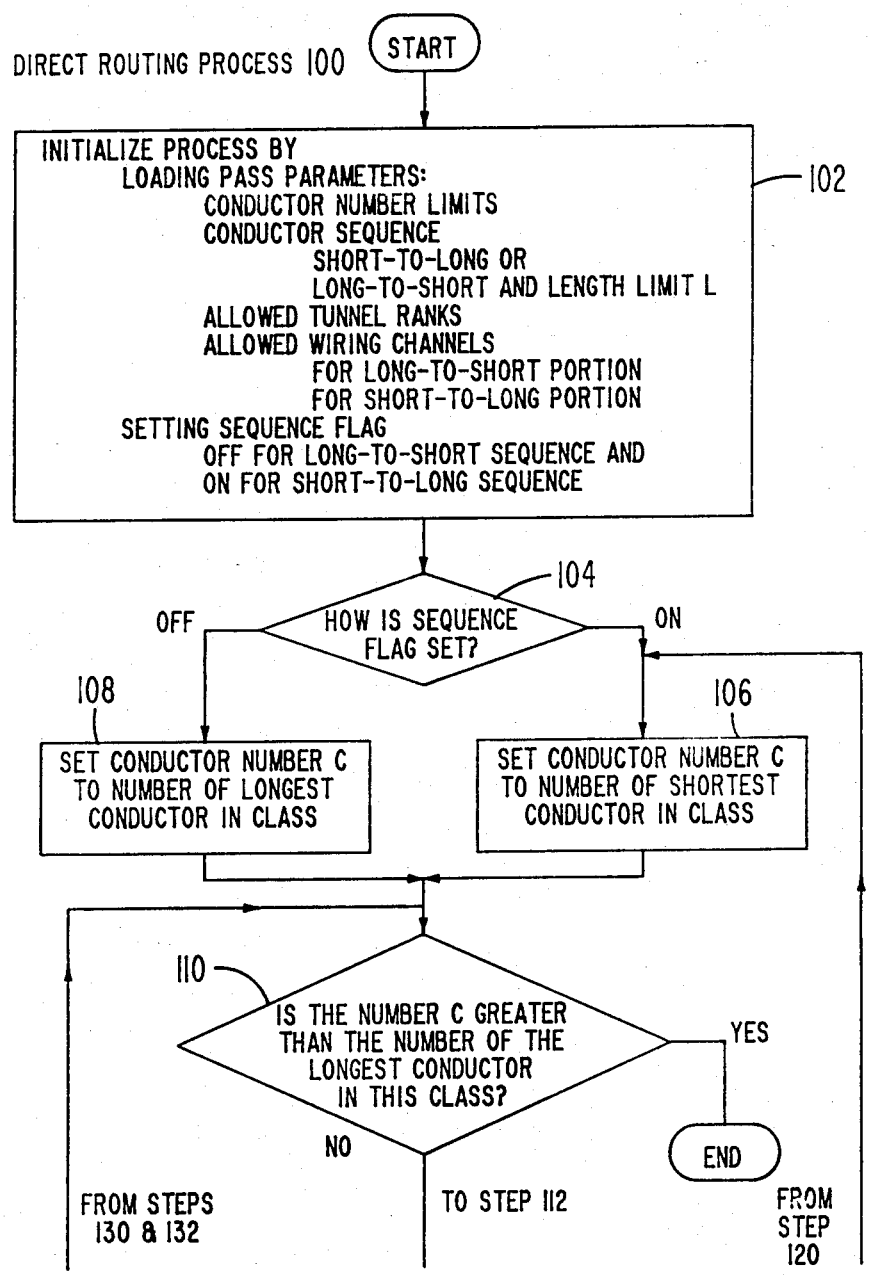
FIGS. 2a and 2b illustrate in flow chart form a prior art direct routing process.
Figure 2B:
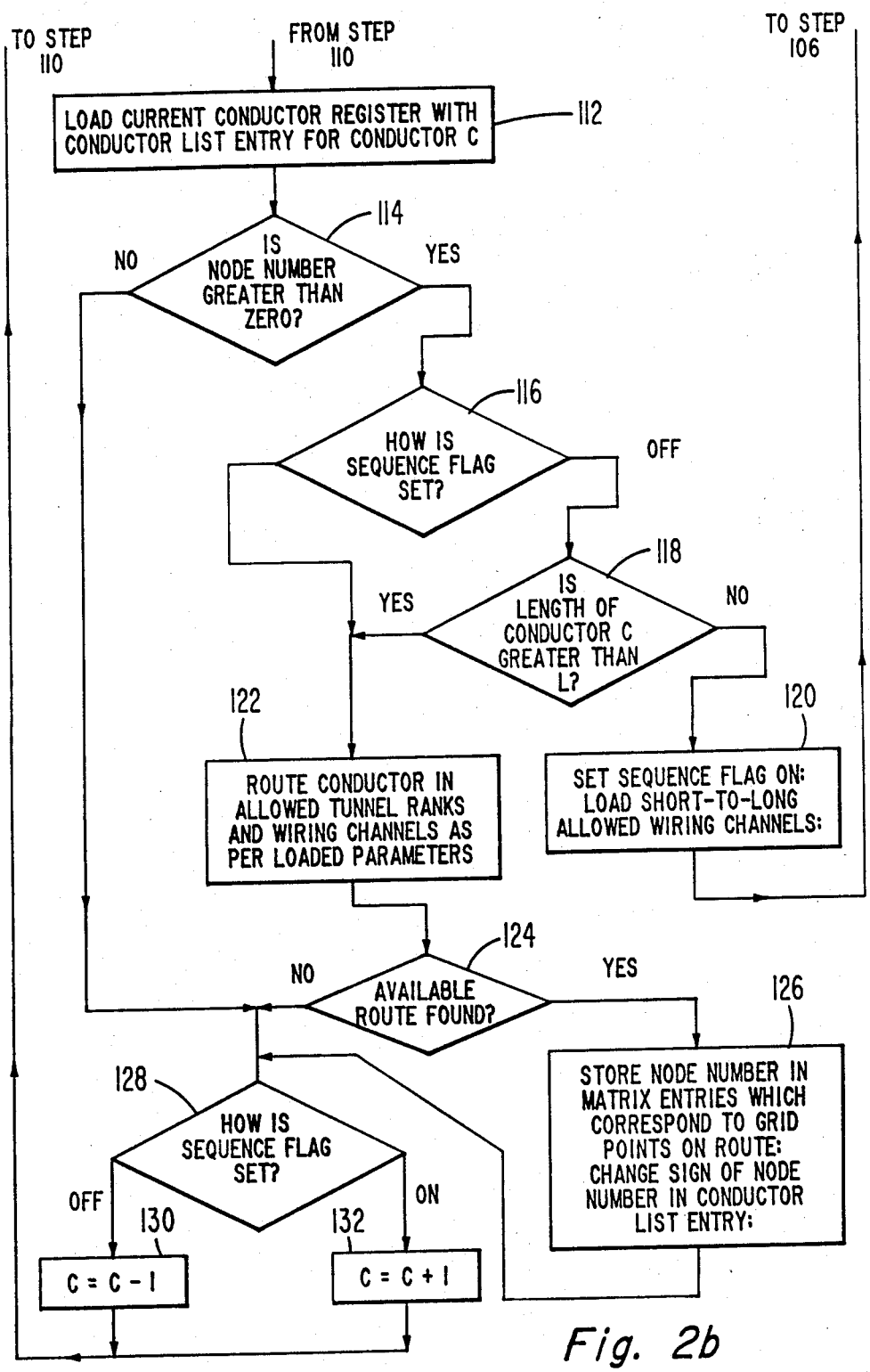

The prior art direct routing process 100 is illustrated in flow chart form in FIG. 2. It begins with an initializing step 102 which loads control parameters for the current execution of the direct routing process and sets a sequence flag. These control parameters include the conductor number of the longest conductor to be routed in this pass and the conductor number of the shortest conductor to be routed in this pass. These control parameters include the sequence in which conductors will be routed. There are two choices. One choice is starting with the longest conductor and proceeding in a long-to-short sequence until a length limit is reached, followed by jumping to the shortest conductor and proceeding in a short-to-long sequence until the longest unrouted conductor in the group is attempted. If this sequence is specified, then the sequence flag is set to OFF. The other choice is starting with the shortest conductor and proceeding through the conductors in a short-to-long sequence only. If this sequence is specified, then the sequence flag is set to ON. When the long-to-short followed by short-to-long sequence is selected, the control parameters also include the length limit L which triggers the jump to the shortest conductor. The control parameters also include the tunnel ranks where conductors are permitted to be routed and the wiring channels over these tunnel ranks in which conductors are permitted to be routed. A specification of which tunnel ranks are allowed for routing is loaded into an allowed tunnel rank register. There can be two different sets of permitted wiring channels—one for a long-to-short order portion of the process and one for a short-to-long order portion of the process. If a long-to-short order followed by a short-to-long order sequence is selected, then step 102 loads the permitted wiring channels for the long-to-short portion of the process into an allowed wiring channel register and saves the permitted wiring channels for the short-to-long portion of the process separately. If the permitted wiring channels are the same for both portions of the process, then the loaded and the saved permitted wiring channels are the same. If only a short-to-long sequence is selected, then step 102 loads permitted wiring channels for the short-to-long into the allowed wiring channels register.

In step 104 the state of the sequence flag is checked. If the sequence flag is ON, the process proceeds to step 106. If the sequence flag is OFF, the process proceeds to step 108.

Step 106 sets the current conductor number to the number of the shortest conductor to be routed in this pass. Step 108 sets the current conductor number to the number of the longest conductor to be routed in this pass. From either step 106 or 108, the process proceeds to step 110.

Step 110 checks to see if the current conductor number C is greater than the longest conductor to be routed in this pass. If C is greater, then the process ends because all conductors have been tried in a short-to-long order. If C is not greater, then the process proceeds to step 112.

Step 112 loads a current conductor register with the entry in the conductor list for the conductor C. In step 114, the node number in the current conductor register is checked to see if it is greater than zero. If it is greater than zero, then conductor C has not been routed and the process proceeds to step 116. If the node number is less than zero, then conductor C has already been routed and the process jumps to step 128 in preparation for selecting a new conductor to route.

Step 116 checks the state of the sequence flag. If it is set OFF, conductors are being processed in a long-to-short order and the process proceeds to step 118. If it is set ON, conductors are being processed in a short-to-long order and the process jumps to step 122.

Step 118 checks to see if the length limit L on the long-to-short portion of the process has been reached by checking to see if the length of conductor C is greater than the length limit L. If conductor C is longer than L, then the process jumps to step 122. If conductor C is not longer than L, then the process proceeds to step 120.

When step 120 is reached, the limit L has been reached. Step 120 accomplishes the jump from the long-to-short portion of the process to the short-to-long portion. To do so, step 120 sets the sequence flag to ON, loads the short-to-long allowed wiring channels into the allowed wiring channel register, and jumps to step 106 to set the current conductor number C to the number of the shortest conductor.

Step 122 follows either step 116 or 118, depending on the sequence in which conductors are being handled. Step 122 routes the conductor in the allowed wiring channels over the allowed tunnel ranks. This is done by checking each channel in the preferred sequence to determine whether it is available from the x-coordinate of one of the conductor pins to the x-coordinate of the other conductor pin. Once an available wiring channel is found, the wiring lane from that channel to each pin is checked. If both are available, then that route is selected for that conductor. If none of the allowed wiring channels is available or if no available allowed wiring channel can be connected to both pins, then no route for conductor C is available at this time. The rows of the M×N routing grid matrix are used for searching for the availability of a wiring channel since the successive grid points on a wiring channel are successive entries in the corresponding row of the matrix. In a similar manner, the wiring lane availability is determined from the corresponding entries in a single column of the routing grid matrix. In checking the availability of a wiring lane, limits may be placed on the number of wiring channels which can be crossed in connecting the wiring channel segment to a pin of a logic cell or to the contact of a tunnel. When a contact can be reached in both directions (upward in the row region and downward in the row region), it is preferred to select the direction which crosses the fewest wiring channels.

Step 124 follows step 122 and tests whether an available route was found for conductor C. If a route was not found, then the process jumps to step 128. If a route was found, then the process proceeds to step 126.

Step 126 stores the number of the node of which conductor C is a part in the routing grid matrix entry of each grid point on the route which was selected. Step 126 also changes the sign of the node number of conductor C in the conductor list from positive to negative as an indication that that conductor has been routed. The process then proceeds to step 128.

Step 128 follows either step 126 or step 124 in accordance with whether or not a route was found. Step 128 checks the state of the sequence flag. If the sequence flag is ON, the process jumps to step 132. If the sequence flag is OFF, the process proceeds to step 130.

Step 130 is reached when the conductors are being handled in a long-to-short sequence and therefore decrements the current conductor number C by 1 so that it is equal to the next conductor in that long-to-short conductor sequence.

Step 132 is reached when the conductors are being handled in a short-to-long sequence and therefore increments the current conductor number C by 1 so that it is equal to the next conductor in that short-to-long conductor sequence.

From either step 130 or step 132, the process jumps back to step 110. The loop of loading conductor data and attempting to route the conductor continues through the attempt (during the short-to-long portion) to route the longest conductor in the group specified in the pass parameters which were loaded in step 102. Once that conductor has been tried in the short-to-long order, the current conductor number C is larger than the number of the longest conductor in the class and step 110 causes this pass of the direct routing process to end.

Figure 3:
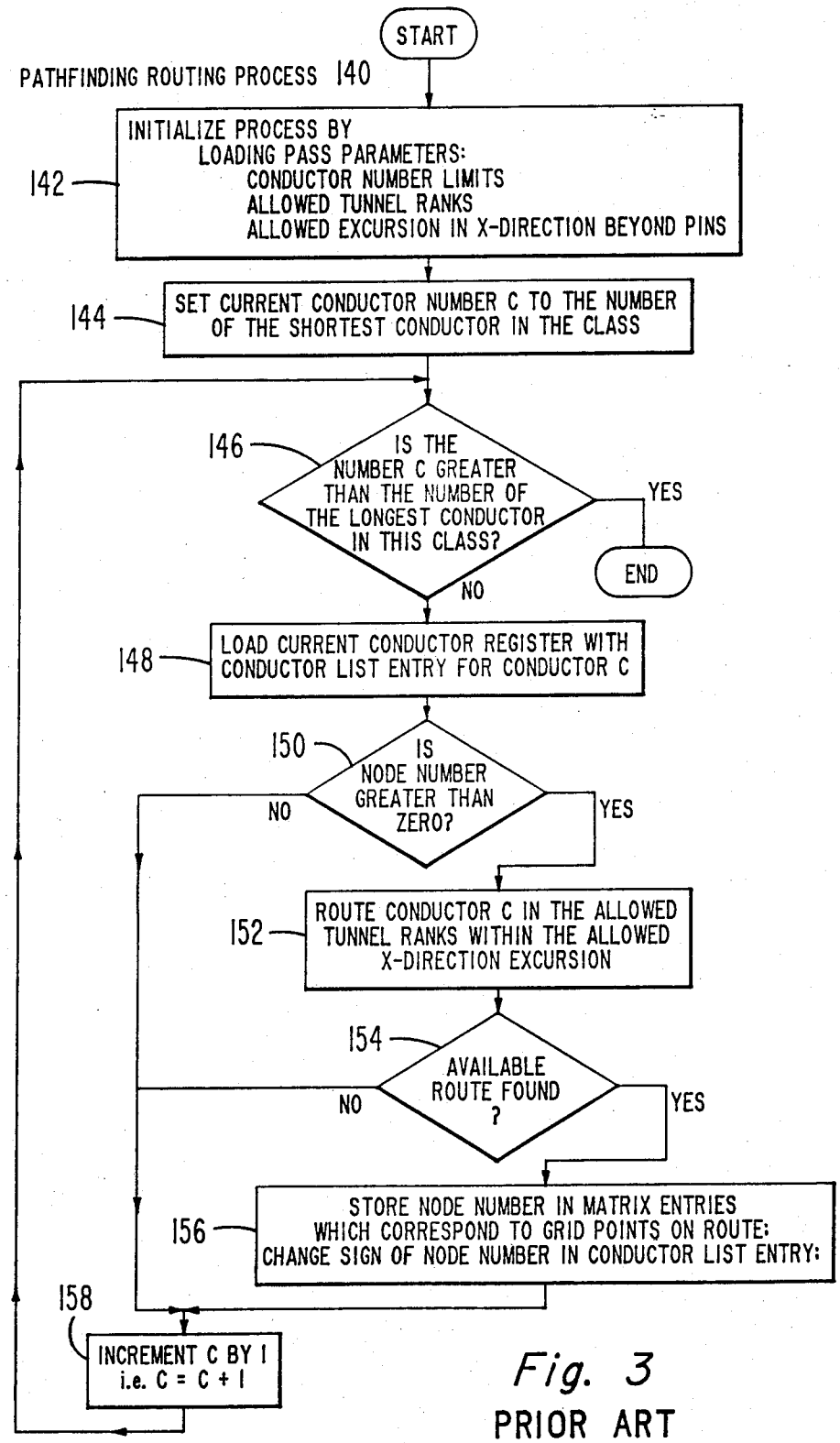
FIG. 3 illustrates in flow chart form a prior art pathfinding routing process.

The prior art pathfinding routing process 140 is illustrated in flow chart form in FIG. 3. It begins with an initializing step 142 which loads control parameters for the current execution of the pathfinding routing process. These control parameters include the conductor number of the longest conductor to be routed in this pass and the conductor number of the shortest conductor to be routed in this pass. The control parameters also include the tunnel ranks where conductors are permitted to be routed and limits on the x-distance by which the route can extend beyond the region between the pins to be connected. Step 142 loads the permitted tunnel ranks into an allowed tunnel rank register and loads the limits on x-direction excursion outside the region between the pins into an x-excursion register.

Step 144 loads the number of the shortest conductor to be routed into the current conductor register.

Step 146 checks to see if current conductor number C is greater than the number of the longest conductor to be routed. If C is larger, then this execution of the pathfinding routing process ends because routing of all of the specified conductors has been attempted. If C is not larger then the number of the longest conductor, then the process proceeds to step 148.

Step 148 loads a current conductor register with the entry in the conductor list for the conductor C. In step 150, the node number in the current conductor register is checked to see if it is greater than zero. If it is greater than zero, then conductor C has not been routed and the process proceeds to step 152. If the node number is less than zero, then conductor C has already been routed and the process jumps to step 158 in preparation for selecting a new conductor to route.

Step 152 pathfinding routes the current conductor C by pathfinding within the allowed tunnel ranks and the allowed x-coordinates for that conductor. This is done by starting at one of the two pins. This pin is referred to as a source pin. The other pin is referred to as a sink pin. At the source pin, each adjacent point on the wiring grid is checked to see if it is available, first by checking to see if it is in the allowed routing region for this conductor and second by retrieving the node number from that grid point's entry in the routing grid matrix. If that node number is zero or the number of the current conductor's node, then that point is available. Otherwise it is unavailable. Each such available grid point is given an energy number of 1. Next, each of the grid points with an energy number of 1 is treated as a source pin and the grid points adjacent to each of them are checked for availability. Any of those adjacent grid points which are available are given energy numbers of 2. Where particular grid points or directions of movement are considered less desirable than others, selection of a grid point as part of the route for the conductor C can be discouraged by assigning the transition to that pin an energy increment of greater than 1. This grid point energization process continues until the sink pin is given an energy number or there are no available grid points adjacent to any of the grid points being treated as source pins. If there are no available grid points, then no route for conductor C is available at this time. If the sink pin is given an energy number, then a route for the conductor C is selected by starting at the sink pin and selecting an adjacent pin having the lowest energy number as the route from the sink pin. Selection of the lowest energy number of the adjacent energized pins avoids use of discouraged grid points and directions where possible. This process of selecting the adjacent lowest energy pin is repeated with the last selected grid point being treated as a sink pin. This process continues until the source pin is reached. At that point, a route for the conductor C has been selected. This process is a variation on the well known solution to the maze runner problem.

Step 154 follows step 152 and tests whether an available route was found for conductor C. If a route was not found, then the process jumps to step 158. If a route was found, then the process proceeds to step 156.

Step 156 stores the number of the node of which conductor C is a part in the routing grid matrix entry of each grid point on the route which was selected. Step 156 also changes the sign of the node number of conductor C in the conductor list from positive to negative as an indication that that conductor has been routed. The process then proceeds to step 158.

Step 158 increments the current conductor number C by 1 so that it is equal to the next conductor in this short-to-long conductor sequence.

From step 158, the process jumps back to step 146. The loop of loading conductor data and attempting to route the conductor continues through the attempt to route the longest conductor in the group specified in the pass parameters which were loaded in step 142. Once that conductor has been tried, the current conductor number C is larger than the number of the longest conductor in the class and step 146 causes this pass of the direct routing process to terminate.

Figure 4:
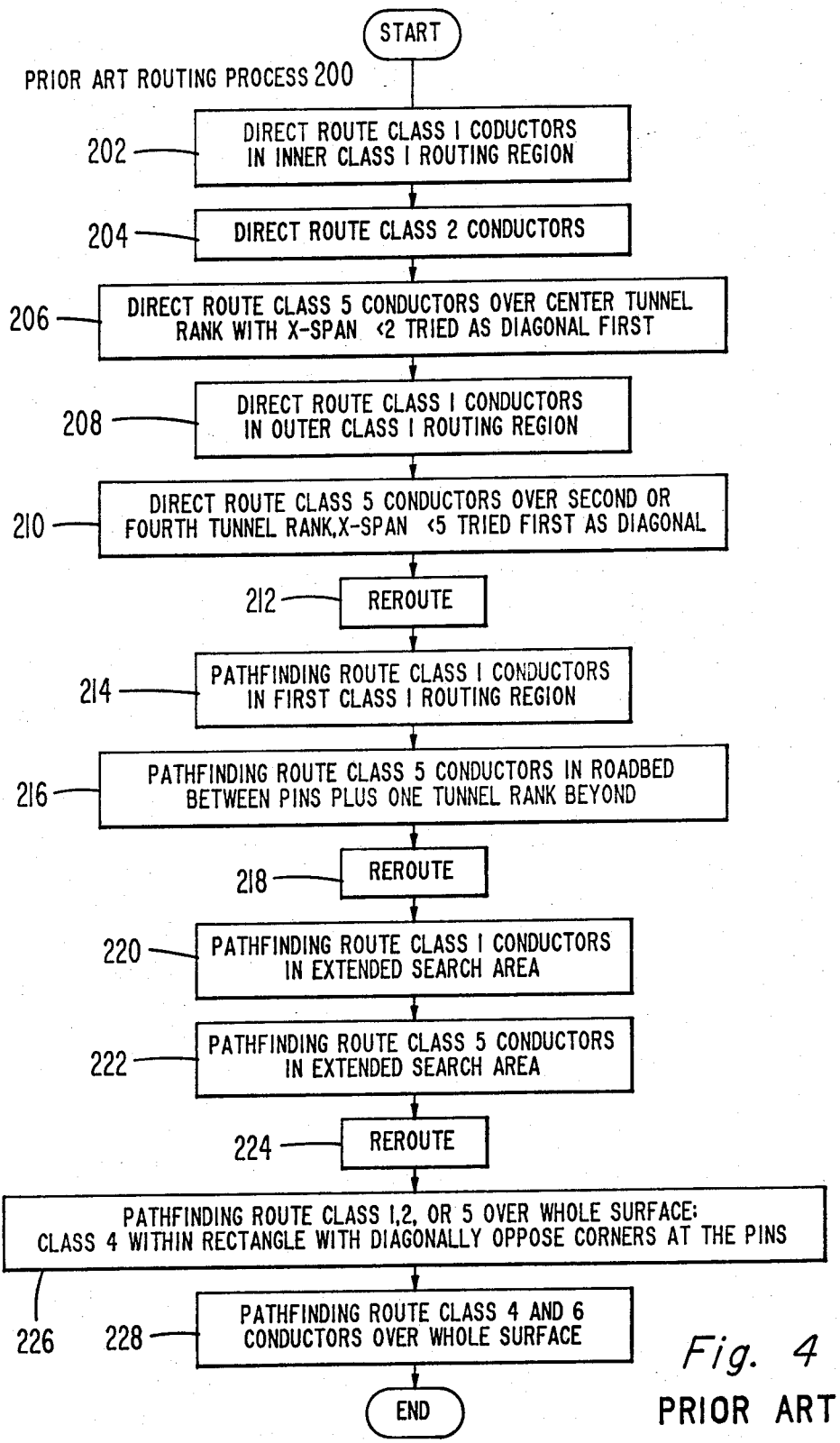
FIG. 4 illustrates in flow chart form a prior art routing process.

The prior art routing process 200 on which this invention improves is illustrated in flow chart form in FIG. 4. It begins with step 202 in which class 1 conductors are direct routed in an inner class 1 routing region using the direct routing process 100. Class 1 conductors are those conductors which connect two pins on the same row. This inner class 1 routing region (470 in FIG. 7) spans the row on which the pins are located and the first tunnel rank on either side of the row. The conductor sequence is the long-to-short sequence followed by the short-to-long sequence. The length limit L which triggers the jump from long-to-short to short-to-long is a length of 60 grid units. A grid unit is the spacing between two adjacent grid points. The allowed wiring channel during the long-to-short portion of the process is the center wiring channel of the three which overlie each of those tunnel ranks. The allowed tunnel ranks during the short-to-long portion of the process are all of the wiring channels which overlie those tunnel ranks.

Step 204, direct routes class 2 conductors. Class 2 conductors are those which connect two pins on a side peripheral region. The pass parameters are a short-to-long sequence with all of the side wiring channels allowed. There is only a single tunnel rank in the side roadbed in the structure with which this prior art process is used. That structure is described in the prior art discussion in a patent application entitled VARIABLE GEOMETRY AUTOMATED UNIVERSAL ARRAY by Richard Noto, Ser. No. 474,511, filed Mar. 11, 1983, and assigned to the present assignee. That Application is incorporated herein by reference.

Step 206 direct routes class 5 conductors which connect adjacent rows. The pass parameters are a long-to-short, then short-to-long sequence with a length limit of 60 grid units. The allowed tunnel rank is the center tunnel rank, except for those conductors whose x-direction length (an x-span) is 0 or 1, grid points. Those conductors are tried first as diagonal routes. Any of the x-span of 1 conductors which do not route as diagonals are tried as single step routes before going on to the next conductor.

Figure 7:
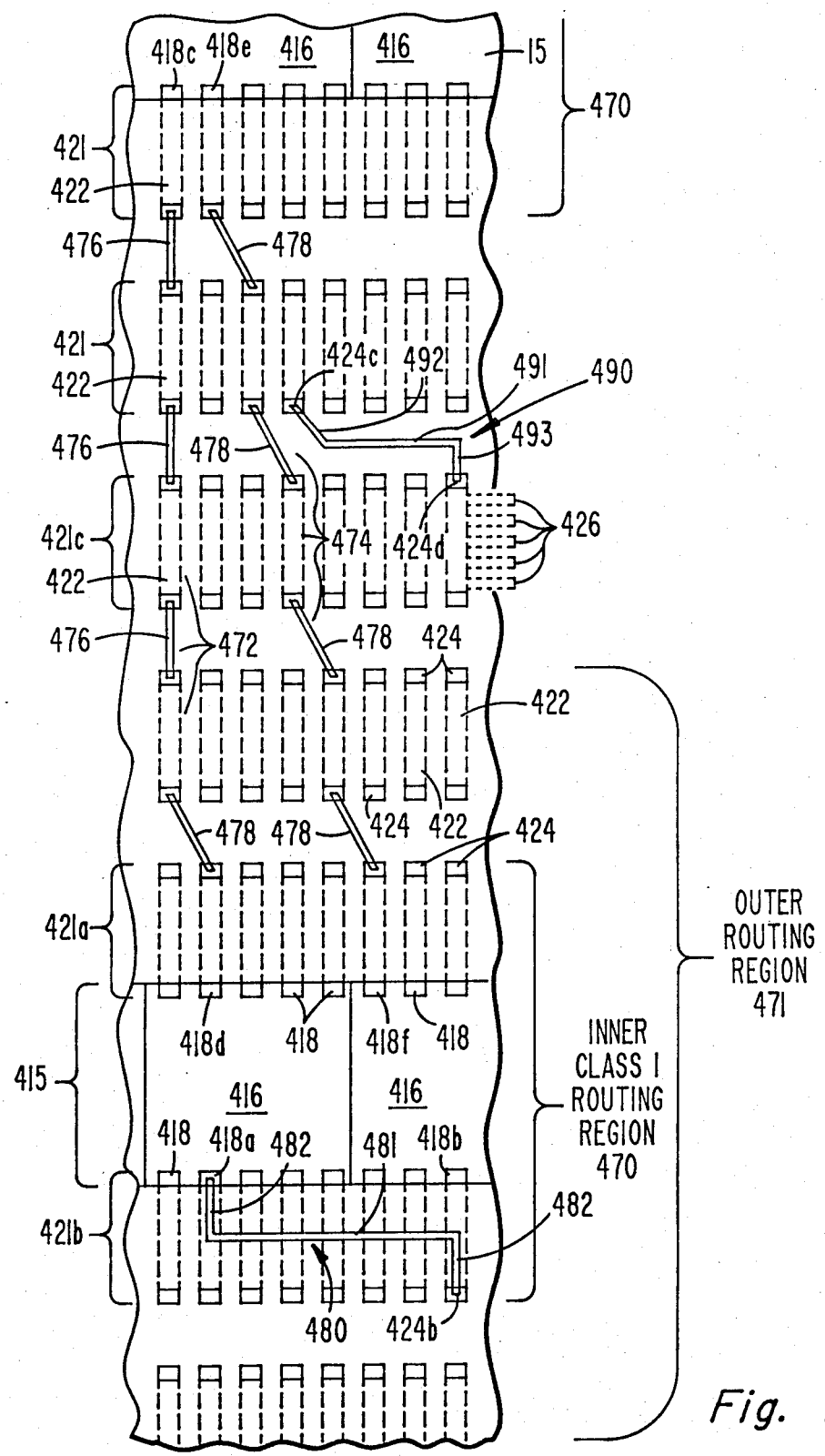
FIG. 7 is a detailed illustration of portions of two adjacent basic unit rows and a portion of the wiring roadbed which spaces them apart.

Step 208 direct routes class 1 conductors in an outer class 1 routing region (471 in FIG. 7). The pass parameters are the same as for step 202, except that the allowed tunnel ranks are the second tunnel rank from the row in each roadbed.

Step 210 direct routes class 5 conductors. The pass parameters are the same as in step 206, except that the allowed tunnel ranks are the second and fourth tunnel ranks. Those class 5 conductors which have an x-span of less than 5 are tried first as diagonal routes and then as single step routes if they fail to route as diagonal routes.

Step 212 is a rerouting step in which an attempt is made to move already routed conductors or portions of them from grid points which are adjacent to logic cell pins or tunnel contacts to grid points which are spaced from those pins and contacts. The purpose of this step is to open up space adjacent to the pins and contacts where additional conductors might be routed. This is done by checking the grid points for the center wiring channel over each tunnel rank. If at least four consecutive ones of those grid points are unused and if the adjacent grid points of an adjacent wiring channel are used, then the conductor or a portion of the conductor in that other wiring channel is moved onto the unused center wiring channel grid points.

Step 214 pathfinding routes class 1 conductors in the inner first class routing region. The allowed tunnel ranks for this execution of the pathfinding routing process are the first tunnel rank on either side of the row. All of the wiring channels over these tunnel ranks are allowed. The x-direction excursion beyond the pins is limited to one grid point.

Step 216 pathfinding routes class 5 conductors, including those which connect non-adjacent rows. All tunnel ranks in the roadbed(s) between their pins plus one tunnel rank beyond that in both directions are allowed. The x-direction excursion is limited to one grid point beyond the pins.

Step 218 again reroutes the already routed conductors in an attempt to open up space adjacent to pins and contacts where additional conductors might be routed.

Step 220 pathfinding routes class 1 conductors in an extended region. All tunnel ranks in the roadbed on either side of the row are allowed, except for the one farthest from the row.

Step 222 pathfinding routes class 5 conductors in an extended search area. The parameters for this step are the same as those for step 216, except that allowed tunnel ranks include all of those in the roadbed(s) between the pins and three roadbeds beyond the pins in both directions. The entire length of each of the allowed roadbeds is permitted in the x-direction.

Step 224 is another rerouting step intended to open up space adjacent to the pins and contacts where additional conductors might be routed.

Step 226 pathfinding routes any remaining class 1, 2, or 5 conductors with the entire routing surface allowed and pathfinding routes class 4 conductors in a rectangular search area two of whose diagonally opposite corners are at the pins which the conductor connects.

Step 228 pathfinding routes any remaining class 4 conductors and any class 6 conductors. The entire routing surface is allowed.

The present invention is an improvement on the AUA automatic placement and routing software described above. The present invention is particularly suitable for use in automatic routing of customizing conductors in universal arrays having the structure which is the subject of the patent application entitled VARIABLE GEOMETRY AUTOMATED UNIVERSAL ARRAY by Richard Noto, which is cited above.

The present invention improves on this prior art process by adding some additional steps, by changing the order in which some of the steps are carried out, and by expanding the capabilities of the direct routing process to make it possible to treat conductors in ways which are dependant on the specific characteristics of those conductors.

In the overall computer aided design process for producing the customizing mask, the routing portion of the process is preceded by the placement portion of the automatic placement and routing process. An improved placement process for use in the computer aided design system 20 is the subject of the related application cited above. The placement process is preferably carried out using that improved process, since that improves the ability of the present invention to successfully route complex, high gate utilization random logic circuits.

Automatic placement and routing software incorporating the present invention is available from ERADCOM, Fort Monmouth, N.J. under the name "VGAUA" or "2700 gate AUA", version 1.3. That VGAUA software is incorporated herein by reference.

Figure 5:
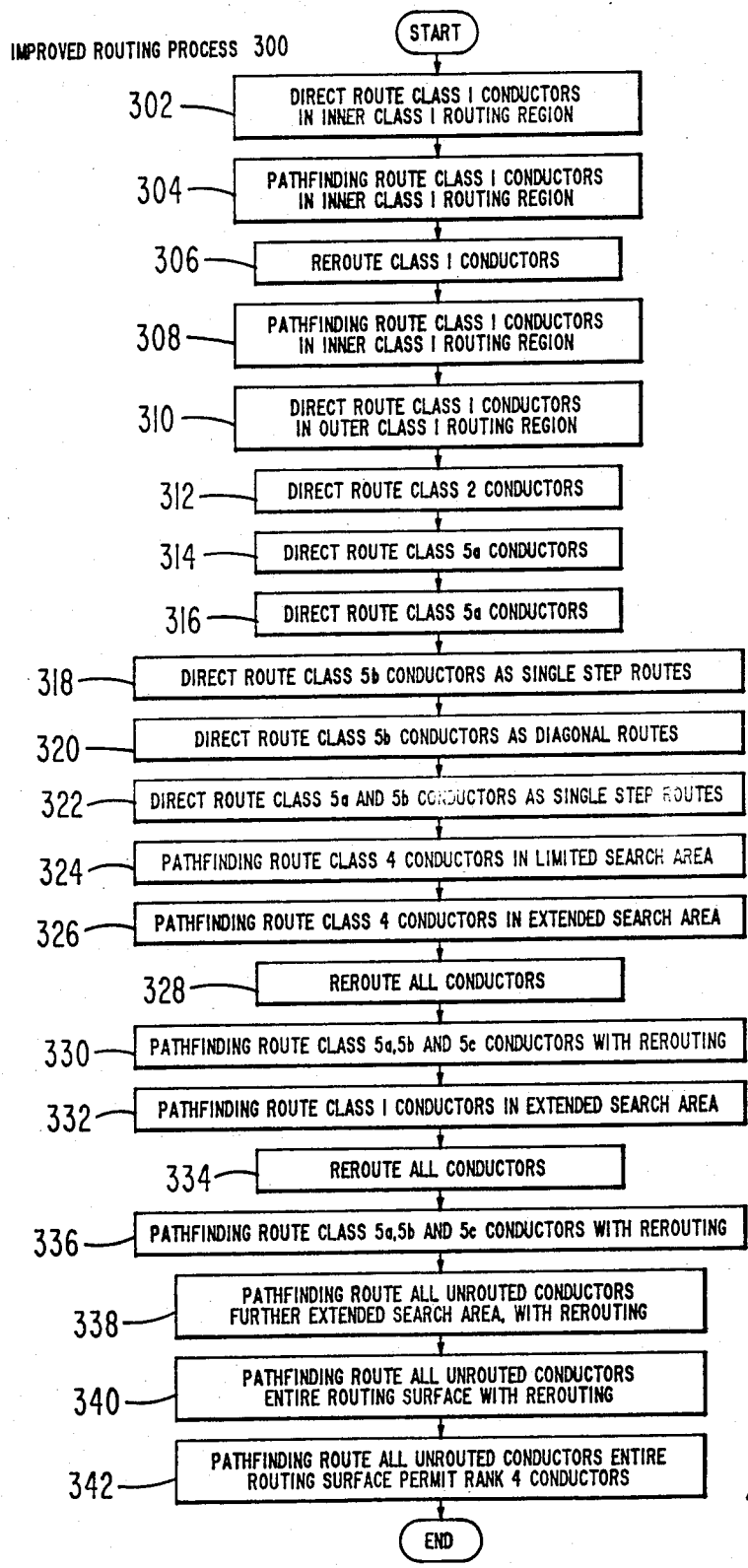
FIG. 5 illustrates in flow chart form a routing process in accordance with the present invention.
Figure 6:
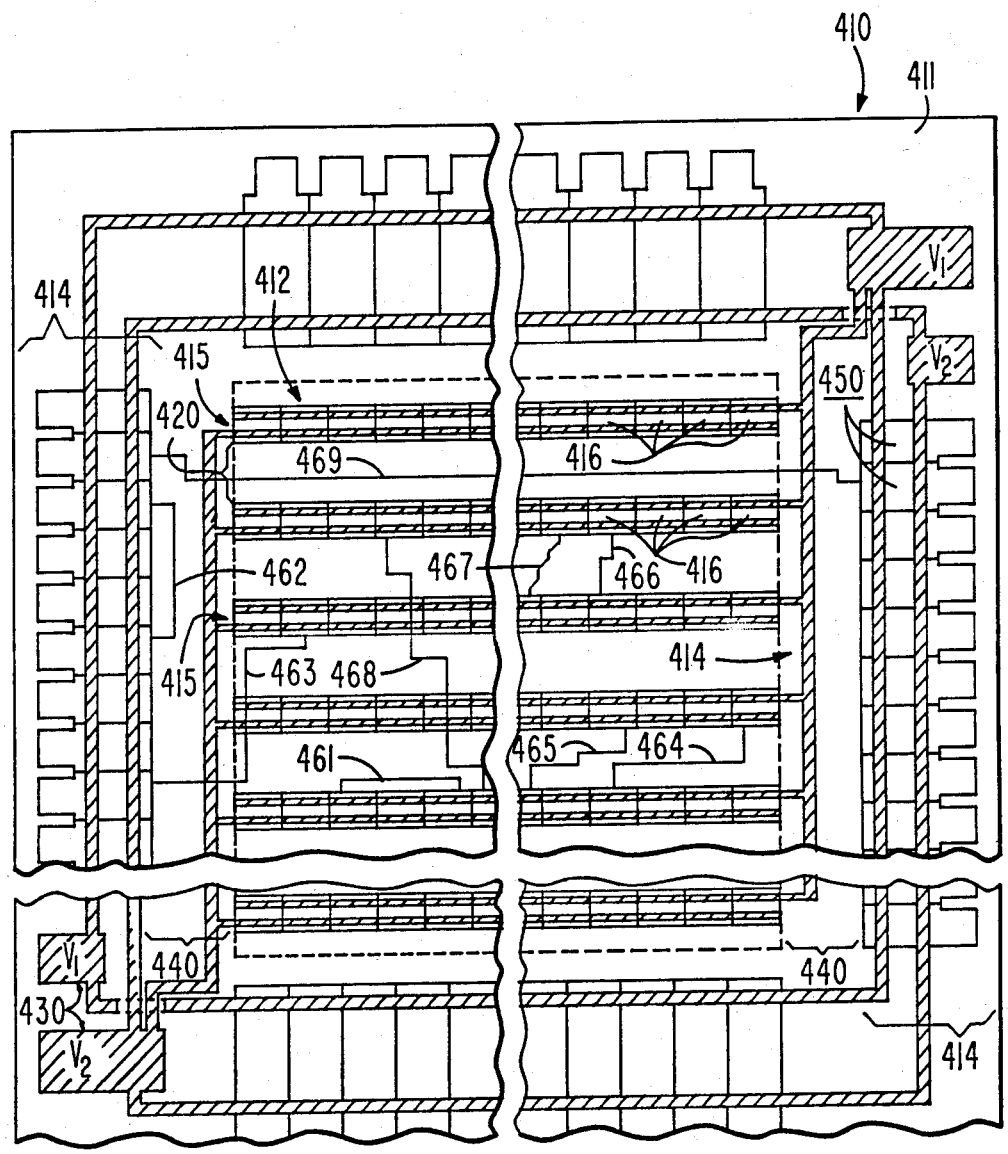
FIG. 6 illustrates the overall layout of a universal array suitable for automatic routing in accordance with the present invention.

The improved direct routing process is illustrated in flow chart form in FIG. 5. Its operation is most effective with a particular array. That array 410 is in accordance with the above VARIABLE GEOMETRY AUTOMATED UNIVERSAL ARRAY Patent Application and is illustrated in FIG. 6. A substrate 411 has a central region 412 containing a plurality of parallel basic unit rows 415 spaced apart by wiring roadbeds 420. Each basic unit row 415 contains a plurality of individual basic units 416. Each basic unit has a number of contacts to which customizing conductors connect in a final IC to provide that IC's desired electrical characteristics. Basic unit contacts are normally referred to as pins. Two columns 414 of side peripheral cells 450 are spaced apart by the central region 412. That central region is spaced from each side column of peripheral cells by a side roadbed 440. A power bus system 430 distributes power to the individual basic units.

Array 410 may have any desired number of tunnel ranks 421 disposed between adjacent basic unit rows and may have any desired number of wiring channels 426 (FIG. 7) over each tunnel rank. These numbers may vary from roadbed to roadbed and different tunnel ranks in the same roadbed may have different numbers of wiring channels disposed over them.

In array 410 each of the tunnels in a tunnel rank (such as rank 421a) which is directly adjacent to a basic unit row has its adjacent-to-the-row contact integral with the basic unit pin in that wiring lane. Thus, the outer contact of each tunnel is permanently connected to the corresponding basic unit pin and is an alternate connection point for conductors which connect to that pin.

The central region of a 2720 gate universal array may preferably have 17 basic unit rows of 160 basic units each. There are typically five ranks of tunnels between adjacent basic unit rows, although there may be fewer tunnel ranks in the outer few roadbeds. Many of the tunnel ranks have five wiring channels over them. However, other numbers may be used if desired.

The definitions of class 1, 2, 4, 5, and 6 conductors used in this routing process are given above in the discussion of the prior art process 200. An exemplary class 1 conductor is identified in FIG. 6 by reference numeral 461. An exemplary class 2 conductor is identified by reference numeral 462. An exemplary class 4 conductor is identified by reference numeral 463. An exemplary class 6 conductor is identified by reference numeral 469. Here class 5 conductors are further divided into class 5a, 5b, and 5c conductors. Class 5a conductors are those class 5 conductors which connect adjacent rows and have a span parallel to the length of the basic unit rows which is greater than or equal to the number of tunnel ranks which separate those basic unit rows. Exemplary class 5a conductors are identified by reference numerals 464 and 465. Class 5b conductors are those class 5 conductors which connect adjacent rows and have a span parallel to the length of the basic unit rows which is less than the number of tunnel ranks which separate those basic unit rows. Exemplary class 5b conductors are identified by reference numerals 466 and 467. Class 5c conductors are those class 5 conductors which connect pins in non-adjacent basic unit rows, independent of the distance between those pins in the direction parallel to the length of the basic unit rows. An exemplary class 5c conductor is identified by reference numeral 468. Class 5c conductors are also known as skip row conductors because they skip over rows without having a contact to a logic cell in that row.

In accordance with the preferred embodiment of the inventive routing process, routing of the customizing conductors preferably begins with the class 1 conductors. This process 300 is illustrated in FIG. 5 and begins with execution of a direct routing process in step 302. During step 302, the direct routing process 100 is executed. The pass parameters for this step are the same as for step 202 in the prior art routing process 200. This restricts permissible routes to the inner class 1 routing region 470 (FIG. 7) which spans the basic unit row to which that conductor connects and extends out above and below that basic unit row to the far end (including the outer contacts) of each of the tunnel ranks 421a and 421b which is directly adjacent to that basic unit row. Conductor 480 in FIG. 7 is an exemplary class 1 conductor. Permissible routes are restricted to routes having only one wiring channel segment such as segment 481 of conductor 480. That wiring channel segment must extend from a first wiring lane which contains one of the pins (418a) to be connected to a second wiring lane which contains the other pin (418b). The wiring channel segment 481 is connected to the pin 418a and the tunnel contact 424b (which is directly connected to pin 418b) by connections 482 which run vertically in the first and second wiring lanes as part of the customizing conductor system. This type of route is referred to as a single step route to distinguish it from a new type of direct route which is discussed subsequently. A single step route is found in the same manner as all of the direct routing process routes were found in direct routing process 100. Because of the integral connection of the tunnels within the class 1 routing region to the basic units, connection to either the basic unit pin itself or the outer tunnel contact is electrically equivalent.

During the long-to-short portion of the process the permissible routes for the class 1 conductors are restricted to the central wiring channels of the allowed tunnel ranks. In FIG. 7 there are five wiring channels 426 over each tunnel rank and three of these wiring channels are considered central wiring channels. The center wiring channel is tried first and if it is not available, then the other two central wiring channels are tried. This forces long conductors which are routed during the long-to-short part of the process to be located away from the contacts at the ends of the tunnels. This prevents these long conductors from being routed in a wiring channel which is directly adjacent to basic unit contacts 418 or tunnel contacts 424. Use of any of those adjacent-to-the-contacts wiring channels for a long conductor at this stage would normally block the routing of many shorter class 1 conductors. During the short-to-long portion of the process the permissible routes include all wiring channels located in the class 1 routing region. Thus, a long conductor which was not routed during the long-to-short portion of the process may be routed during the short-to-long portion of the process by using a wiring channel which was not permissible during the original attempt to route that conductor. At this stage routing such a long conductor in that location no longer presents the danger of blocking the routing of many shorter class 1 conductors since the routing of those shorter conductors has already been attempted.

The completion of the short-to-long portion of the direct routing process completes step 302. In step 304 the routing of any remaining unrouted class 1 conductors is attempted using a pathfinding routing process. Permissible routes are limited to those within the class 1 routing region and conductors are routed in a short-to-long sequence. Step 304 is the same as step 214 of the prior art process 200. However, it occurs in a different place in the routing process and thus produces different routing than it would produce in the prior art process 200.

Step 304 is followed by step 306 which is the execution of a rerouting process to move already routed class 1 conductors or portions thereof as far away from the contacts to the basic units and tunnels as possible. This step is new to process 300, but is carried out in the same manner as in the prior art. This moves unoccupied segments of the wiring channels next to basic unit pins or tunnel contacts. In this context, "away from the contacts to the basic units" means away from both the contacts 418 which are part of the basic units themselves and the contacts 424 at the far end of the each tunnel in the class 1 routing region.

Where space is available, the rerouting process moves either a complete wiring channel segment of a conductor or one or more portions of such a segment in accordance with the sizes and relative alignment between the available unoccupied wiring channel segment(s) and the conductor segment to be moved.

After completion of the step 306 rerouting process, step 308 repeats the pathfinding routing process of step 304. This execution of the pathfinding routing process is normally able to successfully route a number of conductors which previously failed to route because access to available wiring channel segments was blocked by other conductors.

Following completion of step 308, class 1 conductors are again direct routed in step 310. The parameters for step 310 are identical to those for step 208 of the prior art process 200. However, step 310 produces different routing because it occurs after the pathfinding routing process in steps 304 and 308 which route many conductors which would otherwise be left for direct routing in this outer class 1 routing region and because it occurs prior to any routing of class 5 conductors.

Next, in step 312 the direct routing process is applied to class 2 conductors. The limitations on this step are the same as for step 204 of prior art process 200.

Figure 8:
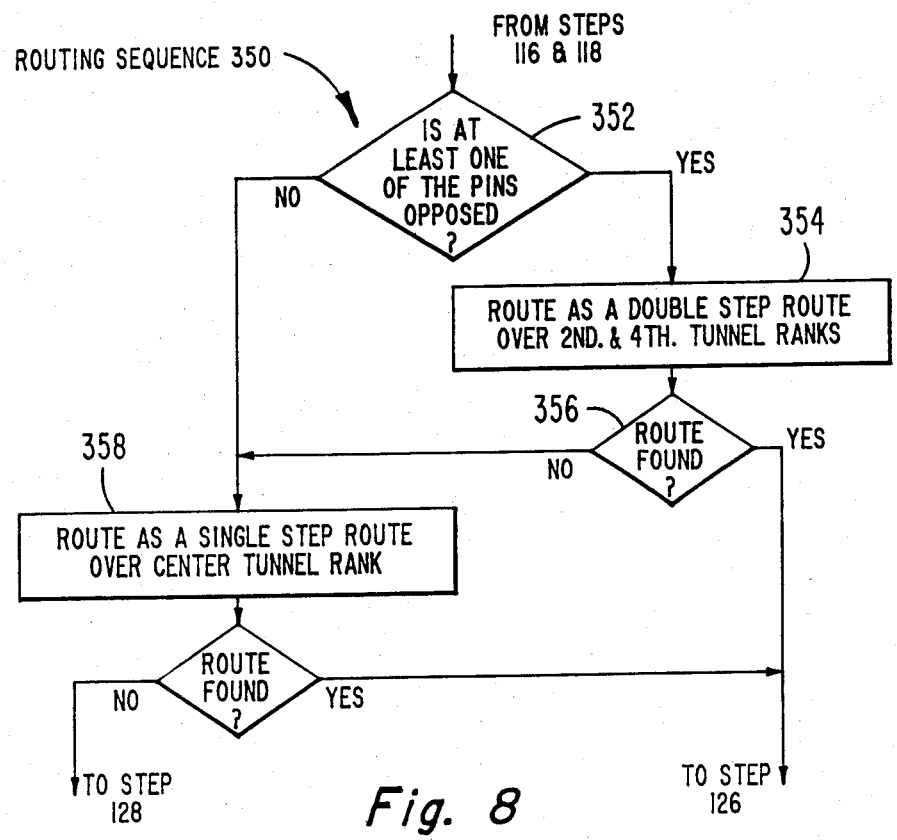
FIG. 8 illustrates in flow chart form an improvement to a portion of the process of FIG. 2.

Next, the routing of class 5 conductors begins with direct routing of class 5a conductors in step 314. The step 314 routing of class 5a conductors employs a modified version of the pathfinding routing process 100. The process is the same, except that step 122 of process 100 is replaced by a sequence 350 of steps which are illustrated in FIG. 8. The steps in sequence 350 treat different conductors differently in accordance with whether they have opposed pins or not. An opposed pin is one which is aligned with a pin which is (1) on the other side of the same roadbed, (2) part of a different node and (3) free of already routed conductors. Step 352 checks the pin across the roadbed from each pin of conductor C to see if it is an opposing pin. If neither is an opposing pin, then the process proceeds to step 358. If either of these pins is opposing, then the sequence proceeds to step 354 which attempts to route conductor C with two non-aligned wiring channel segments connected by a vertical segment. Such a route is referred to as a double step route because of its appearance. Conductor 465 in FIG. 6 is an example of a such a double step route. In a double step route the vertical (wiring lane) segment connecting the two wiring channel segments must be in a wiring lane in which no pin remains to be routed in that roadbed (either there is no connection needed to either of the pins or a connection has already been routed). A location for this vertical connection between the wiring channel segments is found first. This connection must have an x-coordinate which is between the two pins conductor C is to connect. The search for this vertical route preferably starts half way between the pins and works outward toward the pins until an available vertical route is found or the pins are reached. If such a vertical route does not exist, then conductor C can not be routed as a double step route at this time. Once a vertical route is found, routes for the wiring channel segments are searched for over the allowed tunnel ranks in the allowed wiring channels. In step 314 the two wiring channel segments of the double step route are restricted to preferred tunnel ranks. The preferred tunnel ranks for each of the wiring channel segments are the tunnel ranks nearest the pin to which it is closest. For a roadbed with five tunnel ranks, the preferred ranks are the two ranks closest to the pin.

Step 356 follows step 354 and checks to see if a route was found in step 354. If one was found, the process proceeds to step 126 of process 100. If no route was found, the process proceeds to step 358.

Step 358 can follow either step 352 or step 356. Step 358 tries to route conductor C as a single step route. The routing of this single step route is the same as step 122 of process 100. Conductor 464 in FIG. 6 is a single step class 5a conductor. In step 314, single step routes are restricted to having their single wiring channel segment over the center tunnel rank (421c in FIG. 7). For roadbeds having an odd number of tunnel ranks, the center tunnel rank is preferably a single tunnel rank. For roadbeds having an even number of tunnel ranks, the center tunnel rank is preferably the two tunnel ranks nearest the center of the roadbed. During the long-to-short portion of the process, each wiring channel conductor segment is restricted to the central wiring channels over the allowed tunnel rank(s). During the short-to-long portion of the process, each wiring channel conductor segment is permitted to be in any of the wiring channels in the allowed tunnel rank(s). Step 358 is followed by step 359 which checks to see if a route was found in step 358. If one was found, then the process proceeds to step 126. If no route was found, then the process proceeds to step 128.

Figure 9:
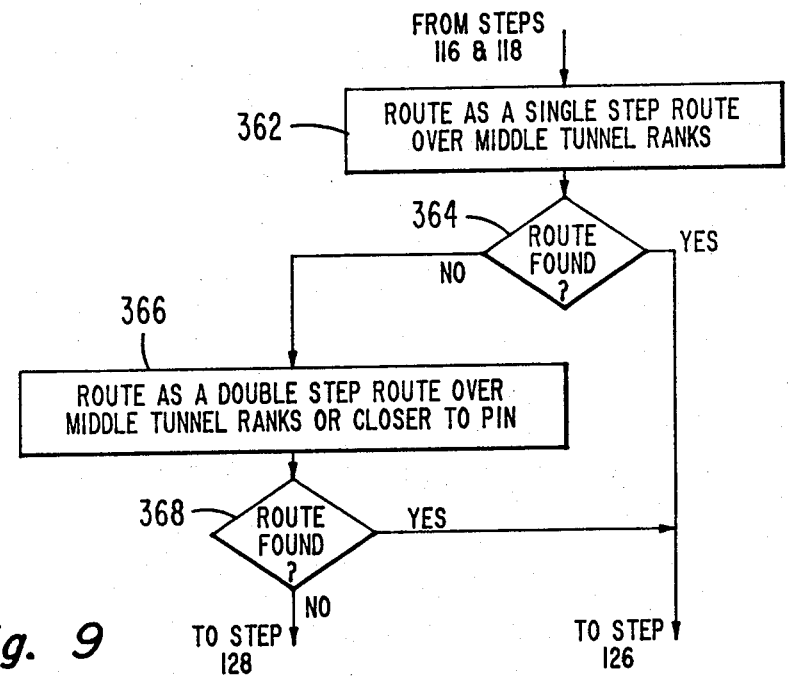
FIG. 9 illustrates in flow chart form another improvement to the same portion of the process of FIG. 2.

Step 314 is followed by step 316 in which the process of direct routing class 5a conductors is repeated with a different set of restrictions on permissible routes. Step 316 uses a different modified version of process 100 than step 314 does. Again, the only modification is the replacement of step 122 by a sequence of steps. In step 316, the replacement sequence is sequence 360 shown in FIG. 9. Step 362 attempts to route conductor C as a single step route. This process is the same as step 122 of process 100. The single wiring channel segment of such a single step route is restricted to being over the middle tunnel rank(s). How many tunnel ranks are considered to be middle tunnel ranks depends on the number of tunnel ranks in that roadbed. For a five tunnel rank roadbed, the center tunnel rank and the tunnel rank on either side of it are preferably considered to be the middle tunnel ranks. Step 364 checks to see if step 362 was successful in finding a single step route. If step 362 was unsuccessful, then the process proceeds to step 366. If step 362 was successful, the process proceeds to step 126. Step 366 attempts to route conductor C as a double step route with each of the wiring channel segments restricted to being over a middle tunnel rank or a tunnel rank which is closer than that to the pin that segment connects to. Thus, in a five rank roadbed, four ranks are allowed for each segment of a double step route in step 366. Step 368 checks to see if a route was found in step 366. If a route was found, the process proceeds to step 126. If no route was found, the process proceeds to step 128.

Following the completion of step 316, an initial attempt is made to route class 5b conductors in step 318. This initial class 5b routing attempt executes the direct routing process 100 while restricting it to single step routes. The single wiring channel segment must be located in a first routing region which contains one of the pins that the conductor connects to. In step 318, the conductors are routed in a short-to-long order.

Following the completion of step 318, step 320 reexecutes the direct routing process for class 5b conductors with permissible routes restricted to diagonal routes. A diagonal route is a route in which there are no conductor segments in the route which run parallel to the length of the basic unit rows. That is, all progress along the length of the basic unit row is achieved via diagonal connections between tunnel ends. In FIG. 7 conductor 472 connecting pin 418c to pin 418d and the conductor 474 connecting pin 418e to pin 418f are diagional routes. Conductor 472 includes three vertical connections 476 and one diagonal connection 478. Conductor 474 includes four diagonal connections 478. Diagonal connections 478 extend from the end of one tunnel to the end of the diagonally adjacent tunnel in the next tunnel rank. A conductor which connects two vertically aligned pins on adjacent basic unit rows is considered to be a diagonal route for purposes of this restriction, since it does not include any parallel to the length of the basic unit row segment. Thus, a diagonal route may have anywhere from no diagonal connections within it up to one less than the number of tunnel ranks which separate the basic unit rows. In a five rank roadbed, diagonal routes can have 0,1,2,3, or 4 diagonal connections between tunnel ranks. This diagonal direct routing process processes the class 5b conductors in a short-to-long order.

Next, in step 322 the unmodified direct routing process 100 is executed for all remaining unrouted class 5a and 5b conductors. This restricts permissible routes to those having a single step. The wiring channel segment of that single step route is permitted to be in any wiring channel over any tunnel rank in the roadbed between the basic unit rows which that conductor connects. This process is executed in a short-to-long order.

Step 322 is the final execution of the direct routing process and the routing process now switches to the pathfinding routing process. Each execution of the pathfinding routing process proceeds through the unrouted conductors in a short-to-long order.

Figure 10:
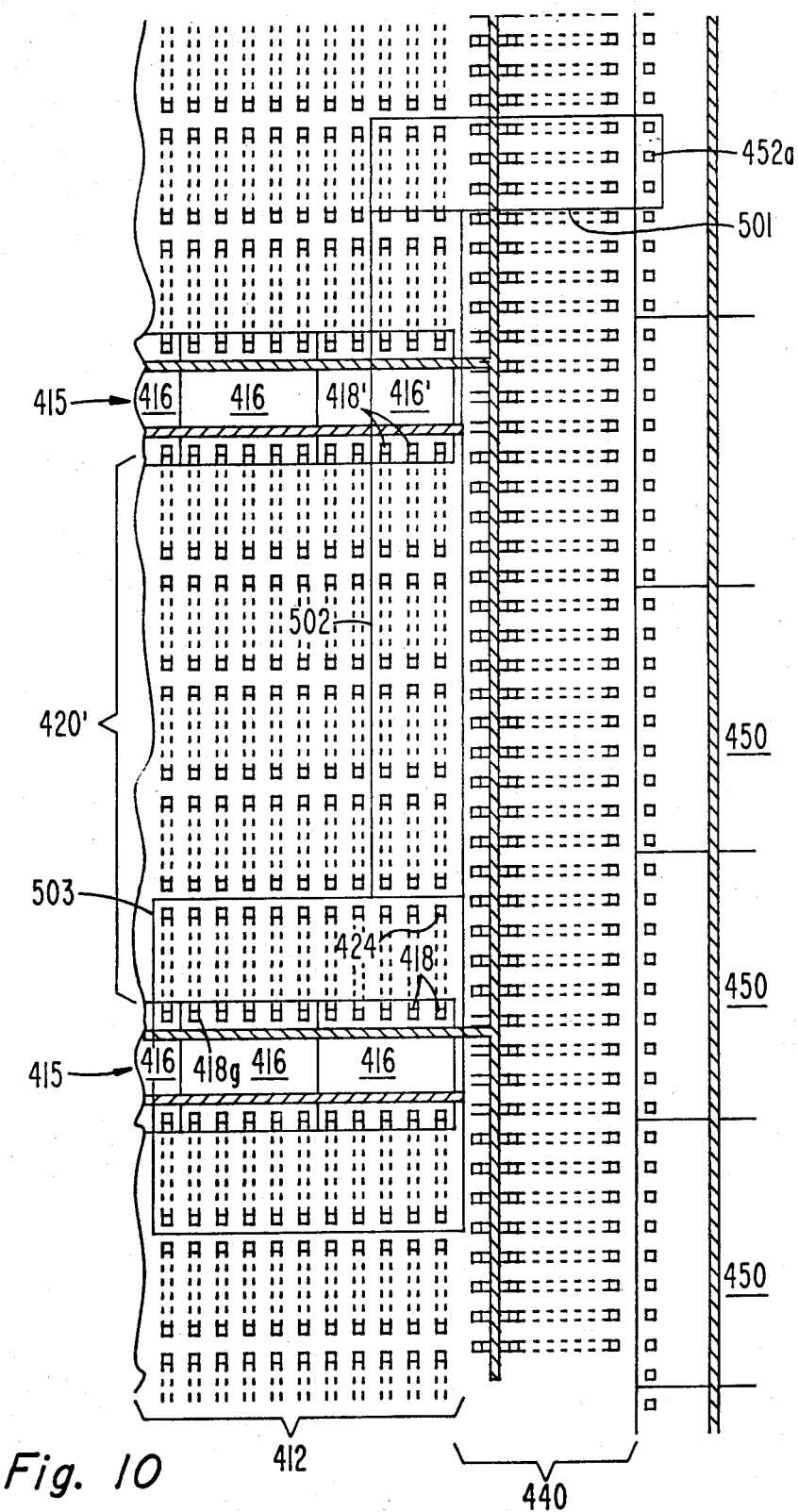
FIG. 10 illustrates a portion of the FIG. 6 structure.

In step 324 the pathfinding routing process is executed for class 4 conductors. The permissible routing region for a class 4 conductor is restricted to three rectangles which together define its preferred routing region. These include a first rectangle (501 in FIG. 10) which extends from that class 4 conductor's side pin 452a to the central or row region, a second rectangle (502 in FIG. 4) which extends from the first rectangle 501 to the roadbed 420 in which that class 4 conductor's row-region pin 418g is located, and a third rectangle (503 in FIG. 4) which extends along the roadbeds on both sides of the row containing pin 418g. Each of these rectangles is narrow in order to restrict the initial attempt to route a class 4 conductor to occupying as little of the side area as possible and to extending into the row region as short a distance as possible except along the roadbed in which its row region pin is located.

In step 326 the routing of any class 4 conductors remaining unrouted after step 324 is attempted in a second pass of the pathfinding routing process. Step 326 is similar to step 324 except for an increase in the size of each of the three rectangles which define the permitted routing region.

Step 328 executes the rerouting process in order to increase the routability of the remaining conductors.

Next, in step 330 the pathfinding routing process is executed for all unrouted class 5 conductors. These conductors include any class 5a or 5b conductors which remain unrouted and all of the class 5c conductors. The pathfinding process is restricted to routes which lie within a rectangular routing region. The rectangular routing region for each conductor is determined by the location of that conductor's pins and encloses those pins. Thus, the rectangular routing region is different from conductor to conductor. In step 330 the rectangular routing region is restricted to enclose in the vertical direction only the two pins which the conductor connects and the roadbeds between them. In the horizontal direction the rectangle is restricted to extend only slightly beyond those pins in each direction. Thus, the rectangle is only slightly wider than the horizontal distance between those pins. During step 330 the rerouting process is executed after every 100 conductors in order to increase the routability of the remaining conductors.

In step 332 the pathfinding routing process is executed for the class 1 conductors in an expanded routing area. In step 332 the routing region includes all of both roadbeds which are adjacent to that conductor's basic unit row except for the tunnel rank in each of those roadbeds which is farthest from that basic unit row.

In step 334 the rerouting process is executed in order to increase the routability of the remaining conductors.

In step 336 the pathfinding routing process is executed for all remaining unrouted class 5 conductors with an extended search area which encompasses the pins to be connected, the full width of the row region between them and one basic unit row in each direction beyond those pins. During step 336 the rerouting process is executed after every 100 conductors in order to increase the routability of the remaining conductors.

In step 338 the pathfinding routing process is executed for all unrouted conductors. The permitted routing region encompasses the pins to be connected, the full width of the row region between them and three basic unit rows beyond them, and the full width of the side routing region adjacent to the permitted portion of the row region. This is the first time that class 6 conductors are attempted, however, normally there are no class 6 conductors. During step 338 the rerouting process is executed after every 100 conductors in order to increase the routability of the remaining conductors.

In step 340 the pathfinding routing process is applied to all unrouted conductors. The permitted routing region includes the entire routing surface from top to bottom and from side to side. During step 340 the rerouting process is executed after every 100 conductors in order to increase the routability of the remaining conductors.

In step 342, a last ditch effort is made to route any still unrouted conductors. The pathfinding routing process is repeated with the permitted routing region including the entire routing surface as in step 340. Routing opportunities are increased in step 342 by allowing conductors to extend parallel to the length of the rows between adjacent tunnel ranks. These conductors are referred to as rank 4 conductors. An exemplary rank 4 conductor is identified by reference numeral 490 in FIG. 7. A rank 4 conductor can be connected to tunnel ends by either a half-diagonal conductor 492 or by a half-vertical conductor 493. Both half-diagonal and half vertical conductors extend from a tunnel end to the center of the region between adjacent tunnel ends. The horizontal portion 491 of the conductor 490 is connected to tunnel contact 424c by the half diagonal conductor 492 and to tunnel contact 424d by half-vertical conductor 493.

Any conductor which remains unrouted after step 342 is a failed conductor which the routing system cannot route.

This routing process has been used for routing the customizing conductors in a 2720 gate universal array which has a single customizable conductive layer. It has successfully routed 100% of the conductors in that array when as much as 90% of the gates were used in a complex random logic circuit. This is a substantial accomplishment for a single customizing layer in such a large array.

Step 342 completes the routing process. The overall computer aided design process for producing the customizing mask proceeds with the conversion of the routing surface data in the M×N routing grid matrix into the specification of the mask. This specification is transmitted through the artwork conversion system 38 and the graphics editor 44 to the artwork mask generating system 46 which produces the mask pattern. Thereafter, that mask pattern is used in a photoetcher to customize a stock universal array wafer to provide the desired IC.

What is claimed is:

1. In a method of routing conductors during the conversion of a universal array into a custom IC where said universal array includes:
   a plurality of basic circuit units each having connection pins;
   said basic circuit units being disposed in parallel rows, in fixed, pre-placed locations, within an overall basic-unit-row region of said array;
   wiring roadbeds within said basic-unit-row region which space said parellel rows apart, each of said wiring roadbeds including:
      a plurality of ranks of fixed conductive tunnels in which each of the tunnels extends perpendicular to the length of said parallel rows,
      a plurality of wiring lanes, each of which comprises a group of said tunnels which are aligned with each other and perpendicular to said rows;
   a plurality of wiring channels disposed over each of said tunnel ranks, each of said wiring channels extending parallel to said rows;
   said universal array having a fixed, pre-fabricated structure up to the level of said wiring channels and the conductors to be routed by said method being at the level of said wiring channels whereby all of the conductors defined by said routing process must fit within the pre-defined structure of said array;
   said method being one which executes both a direct routing process and a pathfinding process for routing conductors to interconnect various ones of said basic unit connection pins to provide said IC, and in which a conductor is referred to as a class 1 conductor if it connects two pins on the same basic unit row, the improvement comprising the steps of:
   (A) executing said direct routing process for each of said class 1 conductors while restricting permissible routes to those routes which are entirely within a first routing region limited to an area spanning said basic unit row to which said class 1 conductor is to connect and out to and including the first rank of tunnels on either side of said basic unit row; and then
   (B) executing said pathfinding routing process for said class 1 conductors which remain unrouted while restricting permissible routes to those routes which are entirely within said first routing region, said pathfinding step being executed prior to any direct routing of said class 1 conductors outside of said first routing region.

2. The method recited in claim 1 further comprising, after step (B), the steps of:
   (C) executing a rerouting process for moving segments of routed conductors which are disposed in wiring channels toward the center wiring channel of the tunnel rank which they overlie; and then
   (D) executing said pathfinding routing process for class 1 conductors which remain unrouted while restricting permissible routes to those routes which are entirely within said first routing region.

3. The method recited in claim 2 further comprising, after step (D), the step of:
   (E) executing said direct routing process for remaining unrouted class 1 conductors while restricting permissible routes to those routes which are entirely within a second routing region limited to an area spanning said basic unit row to which said class 1 conductor is to connect and out to and including the second rank of tunnels on either side of said basic unit row.

4. The method recited in claim 1 wherein a conductor is referred to as a class 5a conductor if it:
   (1) connects two pins located on adjacent basic unit rows and
   (2) spans a number of said wiring lanes which is equal to or greater than a first predetermined number which is greater than one and
   a pin is referred to as being opposed if it is aligned with a pin which is:
   (1) on the other side of the same roadbed
   (2) in a different node and
   (3) free of already routed conductors; said method further comprises, after step (B), routing each class 5a conductor in a manner which is dependent on that conductor's characteristics with the steps of:
   (C) executing said direct routing process configured to route conductors having at least one opposed pin with two segments in wiring channels, said two segments being in different wiring channels and restricted to wiring channels over preferred tunnel ranks; and
   (D) if step (C) is unsuccessful in routing a conductor having an opposed pin or if the conductor has only unopposed pins, then direct routing said conductor using a single wiring channel, with that single channel being within a set of preferred wiring channels over the center tunnel rank.

5. The method recited in claim 4 wherein:
said direct routing process when applied to claim 1 or 5a conductors first processes conductors in an order of longest to shortest conductor span parallel to the length of the basic unit rows until a predetermined limit is reached and then processes said conductors which remain unrouted in an order of shortest to longest conductor.

6. The method recited in claim 5 wherein:
during said long-to-short portion of said processing, permissible routes are restricted to those routes using wiring channels which are within the central wiring channels over the allowed tunnel rank; and
during said short-to-long portion of said processing, permissible routes include all of the wiring channels over the allowed tunnel ranks.

7. The method recited in claim 4 further comprising, after step (D), the steps of:
(E) executing said direct routing process for all unrouted class 5a conductors while restricting permissible routes to those routes using a single wiring channel located over the middle rank(s) of tunnels; and
(F) if step (E) fails to find an available permissible route for a conductor, then restricting permissible routes for that conductor to those using two wiring channels, each of which is permitted to be over the middle rank(s) of tunnels and any rank of tunnels between the middle rank(s) and that conductor's closest pin.

8. The method recited in claim 7 wherein a conductor is referred to as a class 5b conductor if it:
(1) connects two pins located on adjacent basic unit rows and
(2) spans a number of said wiring lanes which is less than said first predetermined number of said wiring lanes;
said improvement further comprises, after step (F), the steps of:
(G) executing said direct routing process for said class 5b conductors while restricting permissible routes to those routes using only one wiring channel with that channel located within said first routing region of one of said basic unit rows to which that conductor connects; and then
(H) executing the direct routing process for remaining unrouted class 5b conductors while restricting that process to diagonal routes.

9. The method recited in claim 8 wherein:
in steps (G) and (H) said process proceeds in a short-to-long conductor order.

10. The method recited in claim 8 further comprising, after step (H), the step of:
(I) executing said direct routing process for all unrouted class 5a and class 5b conductors while restricting permissible routes to those routes using a single wiring channel and while permitting that channel to be any wiring channel over any tunnel rank between the adjacent rows connected by the conductor being routed.

11. The method recited in claim 10 wherein the process in step (I) proceeds in a short-to-long conductor order.

12. The method recited in claim 10 wherein said universal array includes side regions containing connection pins, said side regions being distinct from said basic unit row region, and a conductor is referred to as a class 4 conductor if it connects a pin on a basic unit row with a pin in a side region and said improvement further comprises, after step (I), the step of:
(J) executing said pathfinding process for class 4 conductors while restricting permissible routes to those routes which lie entirely within an area encompassed by a first rectangle including said side pin and extending into said basic unit row region, a second rectangle within said row region and extending from said first rectangle into the roadbed on which said basic unit row pin lies and a third rectangle which extends from said second rectangle along the roadbeds on both sides of the row containing said basic unit row pin.

13. The method recited in claim 12 wherein:
a conductor is referred to as a class 5c conductor if it connects two pins on non-adjacent rows, and
said method further comprises, after step (J), the step of:
(K) executing said pathfinding routing process for all class 5c conductors and all unrouted class 5a and class 5b conductors.

14. The method recited in claim 13 further comprising, after step (K), the step of:
(L) executing said pathfinding process for all unrouted conductors while permitting conductors to run parallel to the length of the basic unit rows in the regions between adjacent tunnel ranks.

15. In a method of routing conductors during the conversion of a universal array into a custom IC where said universal array includes:
a plurality of basic circuit units each having connection pins;
said basic circuit units being disposed in fixed, parallel rows within an overall basic unit row region of said array;
wiring roadbeds within said basic-unit-row region which space said parallel rows apart, and
side regions containing connection pins, said side regions being distinct from said basic unit row region,
said method being one which executes a pathfinding process for routing conductors in said universal array integrated circuit and a conductor is referred to as a class 4 conductor if it connects a pin in a side region to a pin on a basic unit row, the improvement comprising the step of:
executing said pathfinding process for class 4 conductors while restricting permissible routes to those routes which lie entirely within an area encompassed by a first rectangle including said side pin and extending into said basic unit row region, a second rectangle within said row region and extending from said first rectangle into the roadbed on which said basic unit row pin lies and a third rectangle which extends from said second rectangle along the roadbeds on both sides of the row containing said basic unit row pin.

16. In a method of routing conductors during the conversion of a universal aray into a custom IC where said universal array includes:
a plurality of pre-placed basic circuit units each having connection pins;
said basic units being disposed in parallel rows, said parallel rows being spaced apart by ranks of fixed conductive tunnels, said tunnels extending perpendicular to the length of the basic unit rows and being arranged in ranks which are spaced apart in a direction perpendicular to the length of said basic unit rows, said method being one which executes a pathfinding process for routing said conductors, the improvement comprising after initially routing conductors while excluding those conductors from extending parallel to said rows in the regions between adjacent tunnel ranks, the step of:

executing said pathfinding process for all unrouted conductors while permitting conductors to extend parallel to said rows in the regions between adjacent tunnel ranks.

17. In a method of converting a logic specification for an IC into the masks necessary to convert a universal array into said IC wherein the universal array is of the type which includes:

pre-placed basic circuit units arranged in parallel rows in an overall basic unit row region, of said array wiring roadbeds within said basic-unit-row region which space said parallel rows apart, each of said wiring roadbeds including:

a plurality of ranks of fixed conductive tunnels in which the tunnels extend perpendicular to said parallel rows and in which over each rank of tunnels is disposed a plurality of wiring channels which extend parallel to said rows, the method being one which (1) automatically determines the placement of logic cells on the basic unit rows of the universal array, (2) automatically determines routes for conductors at the level of said wiring channels to properly interconnect the universal array basic units to produce the specified logic and (3) automatically generates the masks necessary to convert the universal array to the IC, the improvement comprising the steps of:

(A) executing a direct routing process for conductors which connect two pins on the same basic unit row while restricting permissible routes to those routes which are entirely within a first routing region limited to an area spanning said basic unit row to which said conductor is to connect and out to and including the first rank of tunnels on either side of said basic unit row; and (B) executing a pathfinding routing process for conductors which connect two pins on the same row while resticting permissible routes to those routes which are entirely within said first routing region, said pathfinding step being executed prior to any direct routing, outside of said first routing region, of said conductors which connect two pins on the same row.

18. A method of converting a logic specification for an IC into the mask necessary to convert a universal array into said IC wherein the universal array is of the type which includes:

pre-placed basic circuit units arranged in parallel rows in an overall basic unit row region, of said array said parallel rows being spaced apart by wiring roadbeds including:

ranks of fixed conductive tunnels in which the tunnels extend perpendicular to said rows, and a plurality of wiring channels which extend parallel to said rows, each rank of tunnels having some of said wiring channels disposed thereover, the method comprising the steps of:

(1) placing specific logic cells at specific locations in said basic unit rows of said universal array;

(2) routing customizing conductors at the level of said wiring channels to properly interconnect said basic units of said universal array to produce the specified logic, said routing step including:

(A) executing a direct routing process for each conductor which connects two pins on the same basic unit row while restricting permissible routes to those routes which are entirely within a first routing region limited to an area spanning said basic unit row to which said conductor is to connect and out to and including the first rank of tunnels on either side of said basic unit row, and (B) executing a pathfinding routing process for each conductor which connects two pins on the same basic unit row and which remains unrouted while restricting permissible routes to those routes which are entirely within said first routing region;

(3) providing an output specifying the configuration of a mask for customizing said universal array to form said IC; and (4) generating said mask.

* * * * *